United States Patent
Yukawa et al.

(10) Patent No.: US 11,802,896 B2
(45) Date of Patent: Oct. 31, 2023

(54) SHEET ELECTRIC RESISTANCE MEASURING INSTRUMENT

(71) Applicant: FUJIFILM Business Innovation Corp., Tokyo (JP)

(72) Inventors: Kouhei Yukawa, Kanagawa (JP); Kenta Ogata, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 17/411,049

(22) Filed: Aug. 24, 2021

(65) Prior Publication Data
US 2022/0373583 A1 Nov. 24, 2022

(30) Foreign Application Priority Data
May 21, 2021 (JP) ................................ 2021-086308

(51) Int. Cl.
*G01R 27/14* (2006.01)
(52) U.S. Cl.
CPC .................... *G01R 27/14* (2013.01)
(58) Field of Classification Search
CPC .. G01R 27/14; G01R 31/2813; G01R 31/281; G01R 1/06722; G01R 1/06727; G01R 27/2641; G01R 27/2635; G01R 15/165; H01H 2211/008; H01H 5/045; H01H 31/16; H01H 1/22; H01H 1/221; H01H 1/225; H01H 1/226; H01H 2001/228; H01H 31/283; H01H 31/32; H01C 1/14; H01C 1/146; H01C 1/148; H01R 12/7064; H01R 13/6597; Y10S 148/146; F05D 2260/38
See application file for complete search history.

(56) References Cited

U.S. PATENT DOCUMENTS 4,335,350 A * 6/1982 Chen .................. G01R 31/2831
324/719
2001/0050565 A1* 12/2001 Petersen ................ G01R 27/14
324/756.07
(Continued)

FOREIGN PATENT DOCUMENTS

CN 101413972 A * 4/2009
CN 101241153 12/2010
(Continued)

OTHER PUBLICATIONS

Napson Corporations. (May 15, 2021). 4-point probe head. Napson Corporation. Retrieved Jan. 13, 2023, from https://web.archive.org/web/20210515050816/https://en.napson.co.jp/products/head/ (Year: 2021).*
(Continued)

*Primary Examiner* — Daniel R Miller
*Assistant Examiner* — Eric Sebastian Von Wald
(74) *Attorney, Agent, or Firm* — JCIPRNET

(57) ABSTRACT

A sheet electric resistance measuring instrument includes first and second housings that are paired with each other and that sandwich a sheet from both sides of the sheet, a pair of electrodes that are provided on the first housing and that measure an electric resistance of the sheet sandwiched between the pair of electrodes and the second housing, and a contact member that is disposed between the pair of electrodes on the first housing and that is brought into contact with the sheet.

12 Claims, 10 Drawing Sheets

(56) References Cited

U.S. PATENT DOCUMENTS

| | | | | |
|---|---|---|---|---|
| 2003/0080763 A1* | 5/2003 | Yu | ...................... | G01R 1/07342 |
| | | | | 324/750.17 |
| 2013/0314112 A1* | 11/2013 | Lai | ..................... | G01R 1/07307 |
| | | | | 324/750.16 |
| 2013/0321016 A1* | 12/2013 | Hirakawa | .......... | G01R 1/06727 |
| | | | | 324/755.01 |
| 2014/0303916 A1* | 10/2014 | Mazzeo | ................. | G01R 27/14 |
| | | | | 702/65 |
| 2018/0052189 A1* | 2/2018 | Johnson, III | ....... | G01R 31/2831 |
| 2021/0003628 A1* | 1/2021 | Limpinsel | .......... | H01R 13/2414 |

FOREIGN PATENT DOCUMENTS

| | | | |
|---|---|---|---|
| CN | 203377839 U | * | 1/2014 |
| CN | 112763802 | | 5/2021 |
| JP | H0926446 | | 1/1997 |
| JP | 2011137774 | | 7/2011 |
| KR | 101562278 | | 10/2015 |

OTHER PUBLICATIONS

Jandel Cylindrical Four Point Probe Head. (May 5, 2021). Four Point Probes. Retrieved Jan. 13, 2023, from https://web.archive.org/web/20210505222115/https://four-point-probes.com/jandel-cylindrical-four-point-probe-head/ (Year: 2021).*

Jandel Engineering Limited. (Jul. 17, 2019). Cylindrical Four-Point Probe Head. Bridge Technology. Retrieved May 11, 2023, from https://web.archive.org/web/20190717002614/http://www.fourpointprobes.com/jandelcylindrical.pdf (Year: 2019).*

Jandel. (Jul. 15, 2019). Multi Height Probe and Multi Height Microposition Probe. Four Point Probes. Retrieved May 11, 2023, from https://web.archive.org/web/20190715031704/http://four-point-probes.com/mhp_instructions.pdf (Year: 2019).*

"Search Report of Europe Counterpart Application", dated Feb. 15, 2022, p. 1-p. 8.

* cited by examiner

SHEET ELECTRIC RESISTANCE MEASURING INSTRUMENT

CROSS-REFERENCE TO RELATED APPLICATIONS

This application is based on and claims priority under 35 USC 119 from Japanese Patent Application No. 2021-086308 filed May 21, 2021.

BACKGROUND

(i) Technical Field

The present disclosure relates to a sheet electric resistance measuring instrument.

(ii) Related Art

Japanese Unexamined Patent Application Publication No. 2011-137774 discloses a technology relating to measuring terminals that are used when the sheet resistance of a thin film is measured by using the four-terminal technique and a measurement lead using these measuring terminals. In this technology of the related art, four measuring terminals are fixed in place in such a manner that a value obtained by dividing a measured voltage by a current is equal to the sheet resistance value of a thin film.

SUMMARY

In the case of measuring the electric resistance of a sheet by placing the sheet between two electrodes and a housing, if a wrinkle, a folded portion, or the like is generated in the sheet when the sheet is placed or when the electrodes come into contact with the sheet, there is a possibility that the accuracy with which the electric resistance is measured may deteriorate.

Aspects of non-limiting embodiments of the present disclosure relate to suppressing generation of wrinkles in a sheet compared with the case where only electrodes come into contact with the sheet.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a sheet electric resistance measuring instrument including first and second housings that are paired with each other and that sandwich a sheet from both sides of the sheet, a pair of electrodes that are provided on the first housing and that measure an electric resistance of the sheet sandwiched between the pair of electrodes and the second housing, and a contact member that is disposed between the pair of electrodes on the first housing and that is brought into contact with the sheet.

BRIEF DESCRIPTION OF THE DRAWINGS

Exemplary embodiments of the present disclosure will be described in detail based on the following figures, wherein.

DETAILED DESCRIPTION

First Exemplary Embodiment

Figure 1:
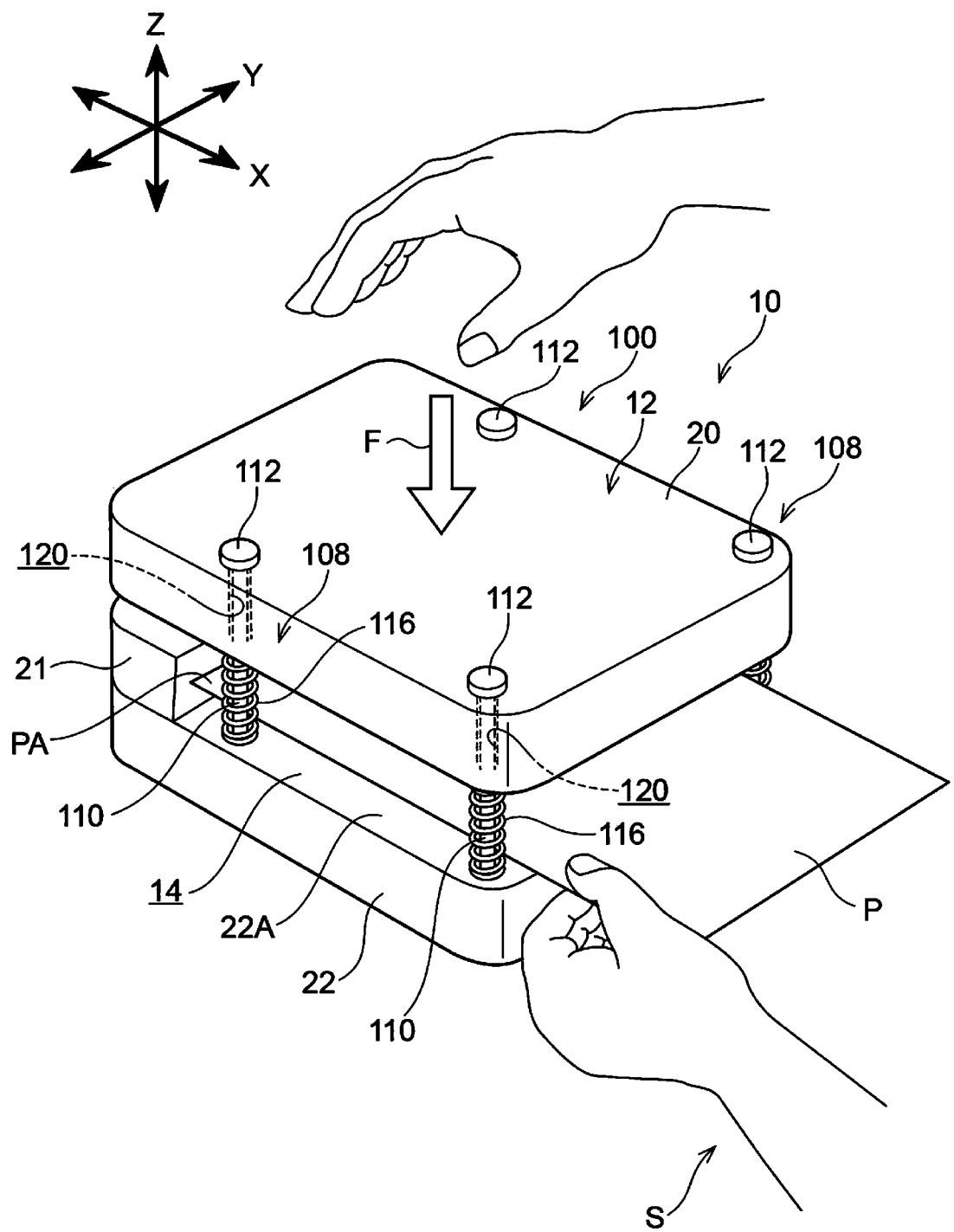
FIG. 1 is a perspective view of a sheet electric resistance measuring instrument of a first exemplary embodiment.

The sheet electric resistance measuring instrument of the first exemplary embodiment of the present disclosure will now be described. Note that, in the drawings, two horizontal directions perpendicular to each other are referred to as the X-axis direction and the Y-axis direction and are indicated by arrows X and Y. In addition, the vertical direction perpendicular to the X-axis direction and the Y-axis direction is referred to as the Z-axis direction and is indicated by arrows Z.

[Structure]

The structure of the sheet electric resistance measuring instrument will now be described.

A sheet electric resistance measuring instrument 10 illustrated in FIG. 1 is a measuring instrument that measures electric resistance of a sheet P, which is paper or the like. The sheet electric resistance measuring instrument 10 includes a housing 12 having a gap 14 formed therein, and the sheet P is to be placed in the gap 14. The housing 12 includes a first housing 20 and a second housing 22. A projecting portion 21 is provided at an end of the second housing 22 in the X-axis direction. The sheet electric resistance measuring instrument 10 of the first exemplary embodiment is used by being placed on, for example, a workbench, which is not illustrated, in such a manner that the second housing 22 faces downward while the first housing 20 faces upward.

Figure 3A:
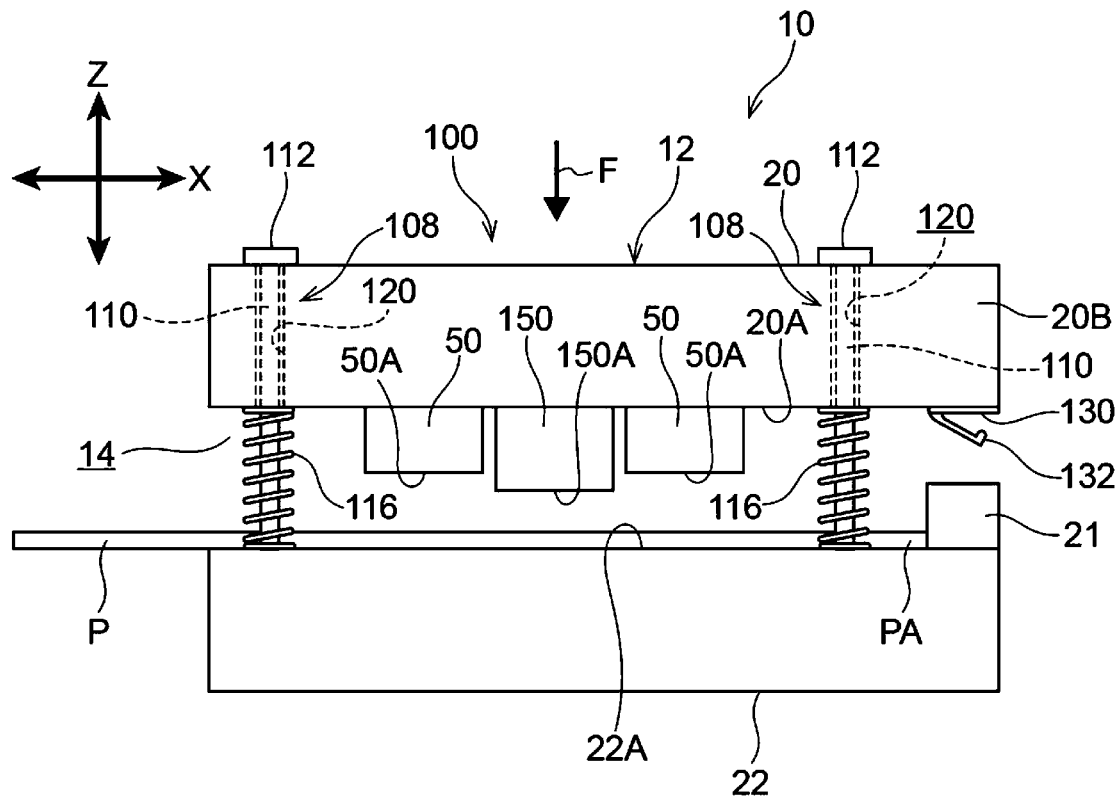
FIGS. 3A and 3B are side views of the sheet electric resistance measuring instrument of the first exemplary embodiment when viewed in the Y-axis direction, FIG. 3A being a diagram illustrating a state where a first housing has moved away from a second housing, and FIG. 3B being a diagram illustrating a state where the first housing has moved toward the second housing and where the electric resistance of a sheet is being measured.
Figure 3B:
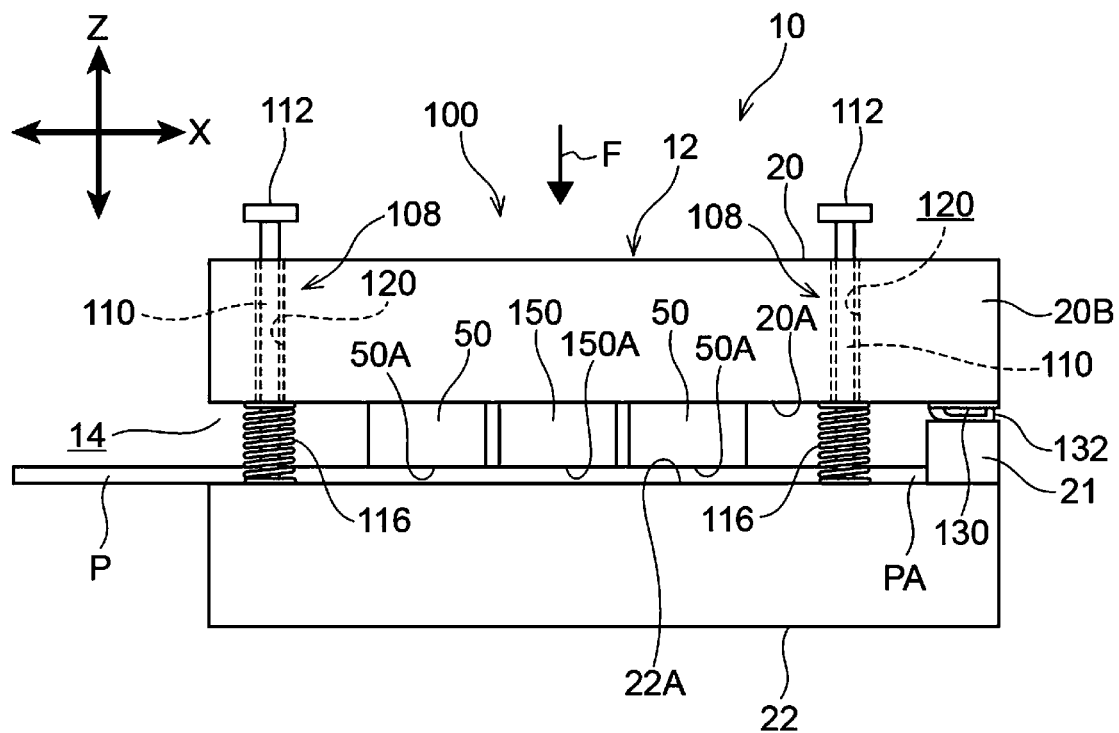

As illustrated in FIGS. 3A and 3B, the sheet electric resistance measuring instrument 10 includes a moving mechanism 100 that enables the first housing 20 to vertically move with respect to the second housing 22. The sheet electric resistance measuring instrument 10 is configured such that the moving mechanism 100 enables the first housing 20 to move toward the second housing 22 (see FIG. 3B) and to move away from the second housing 22 (see FIG. 3A). The moving mechanism 100 includes guiding mechanisms 108 and coil springs 116. Each of the guiding mechanisms 108 includes a guide 110 having a rod-like shape and has an insertion hole 120.

As illustrated in FIG. 1, FIG. 3A, and FIG. 3B, the second housing 22 is equipped with the plurality of (four in the first exemplary embodiment) rod-shaped guides 110 that project from a top surface 22A, and the first housing 20 has the plurality of insertion holes 120 (see FIG. 3A and FIG. 3B) through which the rod-shaped guides 110 are inserted. Each of the guides 110 has a head portion 112 at an end thereof, the head portion 112 being larger in size than the corresponding insertion hole 120 (see FIG. 3A and FIG. 3B). In addition, each of the rod-shaped guides 110 is inserted through one of the coil springs 116 (see FIG. 3A and FIG. 3B).

With such a configuration, the first housing 20 is pushed in a direction away from the second housing 22, that is, the first housing 20 is pushed upward (see FIG. 3A). However, as indicated by arrow F, when a measurer S (see FIG. 1) pushes the first housing 20 toward the second housing 22, that is, when the measurer S pushes the first housing 20 downward, the first housing 20 moves vertically downward along the guides 110 and comes close to the second housing 22 (see FIG. 1 and FIG. 3B).

As illustrated in FIG. 3A and FIG. 3B, a switch 130 with a lever 132 is disposed on an end portion 20B of the first housing 20. As illustrated in FIG. 3A, the switch 130 is off in the state where the first housing 20 is spaced apart from the second housing 22. On the other hand, as illustrated in FIG. 3B, when the first housing 20 moves vertically downward as a result of the measurer S (see FIG. 1) pushing the first housing 20 toward the second housing 22 and comes close to the second housing 22, the lever 132 of the switch 130 comes into contact with the projecting portion 21, and the switch 130 is turned on.

Figure 2:
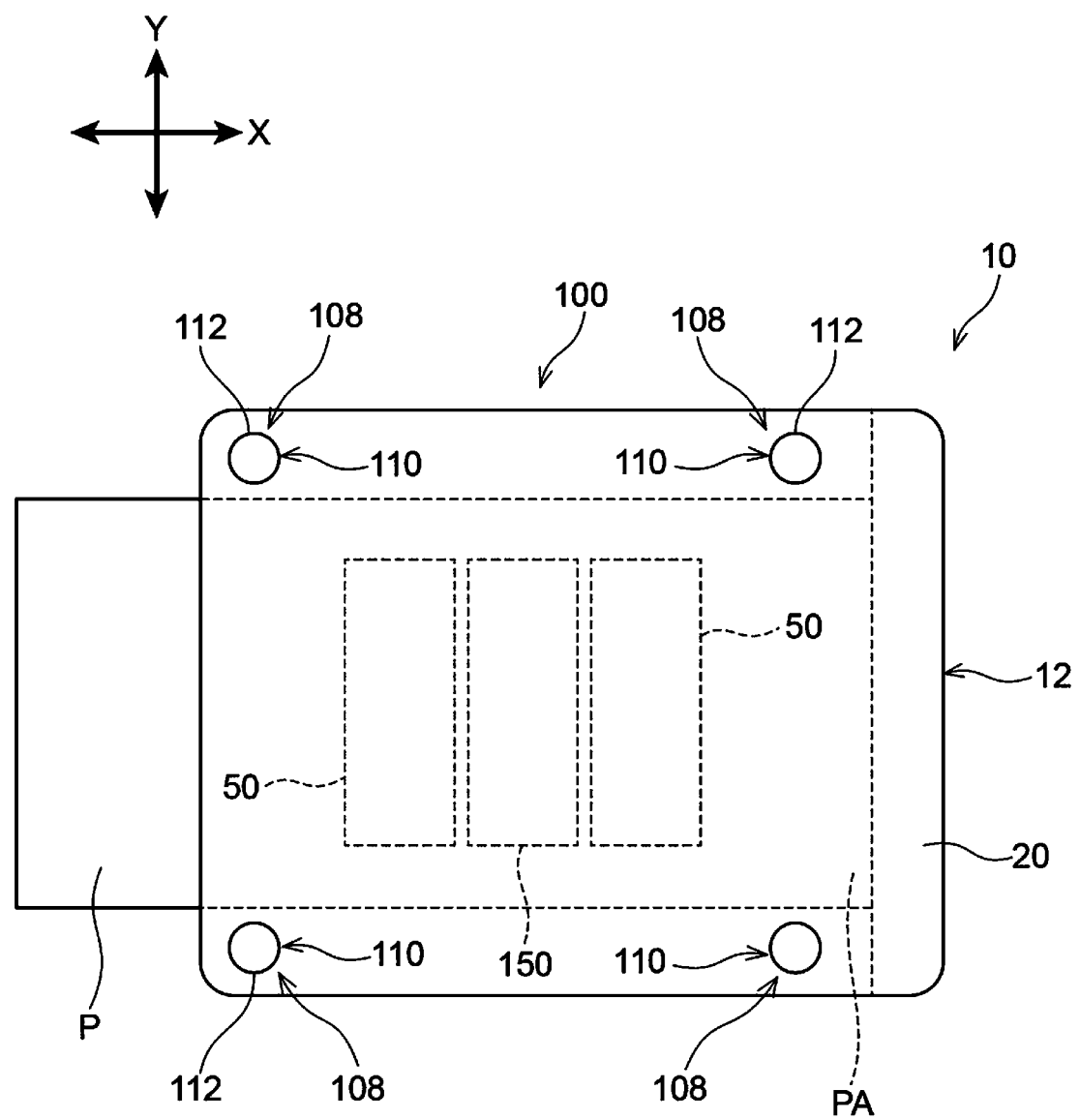
FIG. 2 is a plan view of the sheet electric resistance measuring instrument of the first exemplary embodiment when viewed from above.

As illustrated in FIG. 3A and FIG. 3B, the top surface 22A of the second housing 22 serves as a placement surface onto which the sheet P is placed (see also FIG. 1). Electrodes 50 are arranged on the first housing 20 so as to be spaced apart from each other in the X-axis direction and so as to project from a bottom surface 20A toward the second housing 22 (see also FIG. 2). A contact member 150 is disposed between the two electrodes 50 (see also FIG. 2). The contact member 150 is made of an insulating material that elastically deforms, and in the first exemplary embodiment, the contact member 150 is made of an insulating rubber material. Note that the term "insulating" refers to the property of a material that does not easily conduct electricity and that has a volume resistivity of about $1\times10^6$ Ωcm or greater.

As illustrated in FIG. 3A, in the state where the first housing 20 is spaced apart from the second housing 22, the contact member 150 projects toward the second housing 22 further than the electrodes 50 do. In other words, a bottom surface 150A of the contact member 150 is located lower than bottom surfaces 50A of the electrodes 50.

Figure 4:
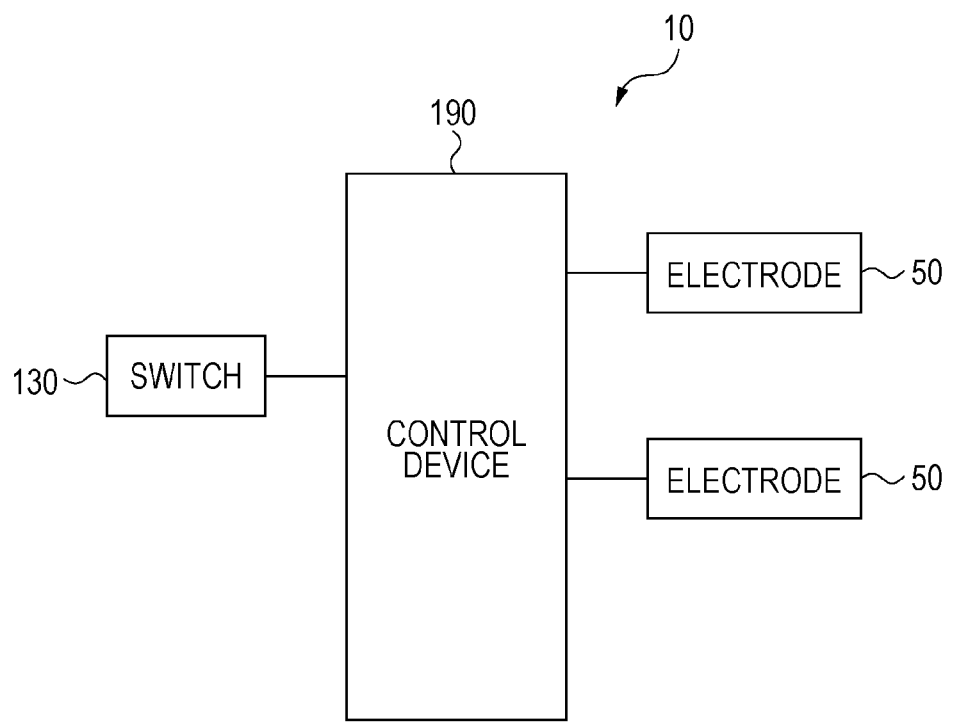
FIG. 4 is a block diagram of the sheet electric resistance measuring instrument of the first exemplary embodiment.

As illustrated in FIG. 4, the sheet electric resistance measuring instrument 10 includes a control device 190. The switch 130 (see FIG. 3A and FIG. 3B) and the electrodes 50 (see FIG. 2, FIG. 3A and FIG. 3B) are electrically connected to the control device 190. The control device 190 has a function of measuring the electric resistance of the sheet P between the two electrodes 50.

Regarding the hardware configuration of the control device 190, the control device 190 is formed of a computer including a central processing unit (CPU) that is not illustrated, read only memory (ROM) that stores, for example, programs for implementing processing routines, random access memory (RAM) that temporarily stores data, a hard disk drive (HDD), a network interface, and so forth.

[Measurement of Electric Resistance of Sheet]

Measurement of the electric resistance of the sheet P will now be described.

As illustrated in FIG. 1 and FIG. 3A, the measurer S (see FIG. 1) places the sheet P onto the top surface 22A of the second housing 22 of the sheet electric resistance measuring instrument 10. In this case, the sheet P is positioned by bringing an end portion PA of the sheet P into contact with a side surface of the projecting portion 21.

As illustrated in FIG. 3B, the measurer S (see FIG. 1) pushes the first housing 20 from above so as to bring the electrodes 50 into contact with the top surface of the sheet P. Note that the contact member 150 projecting downward further than the electrodes 50 do comes into contact with the sheet P first. Since the contact member 150 is made of rubber, the contact member 150 is elastically deformed and compressed upon the contact with the sheet P, and then the electrodes 50 come into contact with the sheet P. In other words, the sheet P is sandwiched between the bottom surfaces 50A of the electrodes 50 and the bottom surface 150A of the contact member 150 and the top surface 22A of the second housing 22. In addition, the switch 130 is turned on.

When a predetermined period of time has elapsed since the switch 130 has been turned on, the control device 190 (see FIG. 4) measures the electric resistance between the two electrodes 50 that are in contact with the sheet P. Note that, in the first exemplary embodiment, the surface resistance of the sheet P between the two electrodes 50 is measured. The measured electric resistance of the sheet P is displayed on a display unit, which is not illustrated.

[Effects]

Effects of the first exemplary embodiment will now be described.

In the sheet electric resistance measuring instrument 10 of the first exemplary embodiment, before the electrodes 50 come into contact with the top surface of the sheet P, the contact member 150, which is disposed between the electrodes 50, comes into contact with the sheet P first. The contact member 150 is elastically deformed and compressed upon the contact with the sheet P, so that the electrodes 50 come into contact with the sheet P.

Here, in the case of a sheet electric resistance measuring instrument of a comparative example that does not include the contact member 150, there is a possibility that wrinkles may be generated in the sheet P when the sheet P is placed onto the top surface 22A of the second housing 22 or when the electrodes come into contact with the sheet P, so that the accuracy with which the electric resistance is measured may deteriorate.

In contrast, in the sheet electric resistance measuring instrument 10 of the first exemplary embodiment, the contact member 150 disposed between the two electrodes 50 comes into contact with the sheet P and suppresses generation of wrinkles in the sheet P.

In addition, in the sheet electric resistance measuring instrument 10 of the first exemplary embodiment, since the contact member 150 disposed between the two electrodes 50 projects downward further than the electrodes 50 do, the contact member 150 comes into contact with the sheet P first and suppresses generation of wrinkles in the sheet P, and then the electrodes 50 come into contact with the sheet P.

In addition, the sheet electric resistance measuring instrument 10 of the first exemplary embodiment is placed onto, for example, a workbench (not illustrated) in such a manner that the second housing 22 faces downward, and the sheet P is placed onto the top surface 22A of the second housing 22. Then, the moving mechanism 100 enables the first housing 20 on the upper side to move from the upper side to the lower side with respect to the top surface 22A of the second housing 22 so as to bring the electrodes 50 and the contact member 150 into contact with the sheet P.

Furthermore, in the sheet electric resistance measuring instrument 10 of the first exemplary embodiment, the guiding mechanisms 108 enable the first housing 20 to move in a direction perpendicular to the top surface 22A of the second housing 22.

As described above, generation of wrinkles in the sheet P is suppressed, and thus, a likelihood that the accuracy with which the electric resistance is measured will deteriorate due to generation of wrinkles in the sheet P is reduced.

Second Exemplary Embodiment

The sheet electric resistance measuring instrument of the second exemplary embodiment of the present disclosure will now be described. The same members as in the first exemplary embodiment are denoted by the same reference signs, and repeated descriptions will be omitted or simplified.
[Structure]
The structure of the sheet electric resistance measuring instrument will now be described.

Figure 5A:
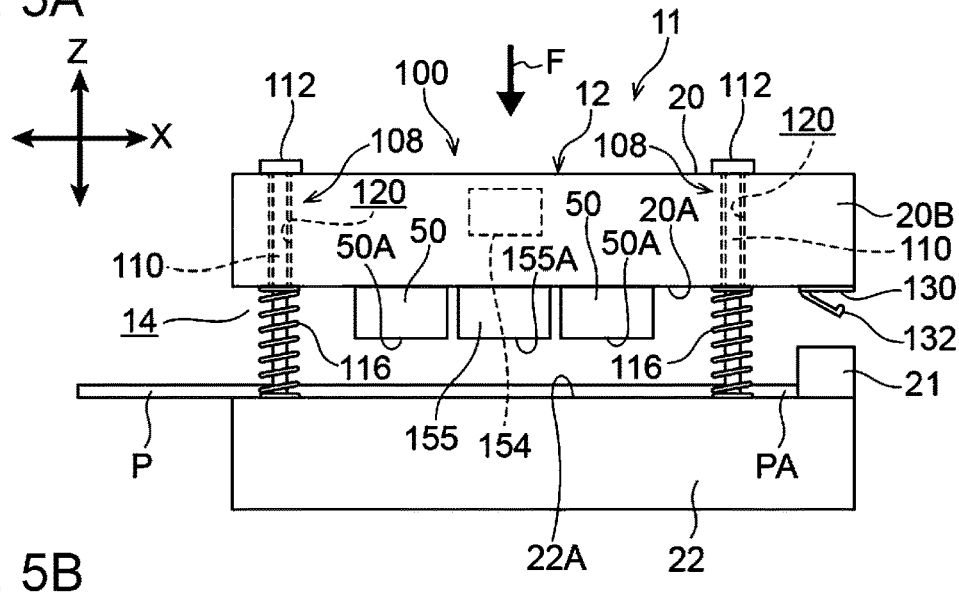
FIGS. 5A to 5C are side views of a sheet electric resistance measuring instrument of a second exemplary embodiment when viewed in the Y-axis direction, FIG. 5A being a diagram illustrating a state where a first housing has moved away from a second housing, FIG. 5B being a diagram illustrating a state where the first housing has moved toward the second housing, and FIG. 5C being a diagram illustrating a state where a contact member has moved away from the sheet and where the electric resistance of the sheet is being measured.
Figure 5B:
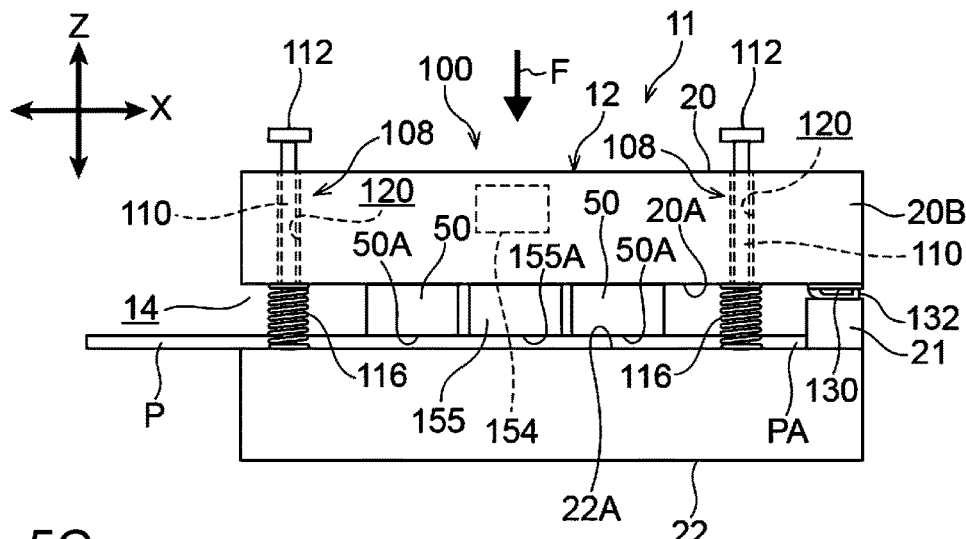
Figure 5C:
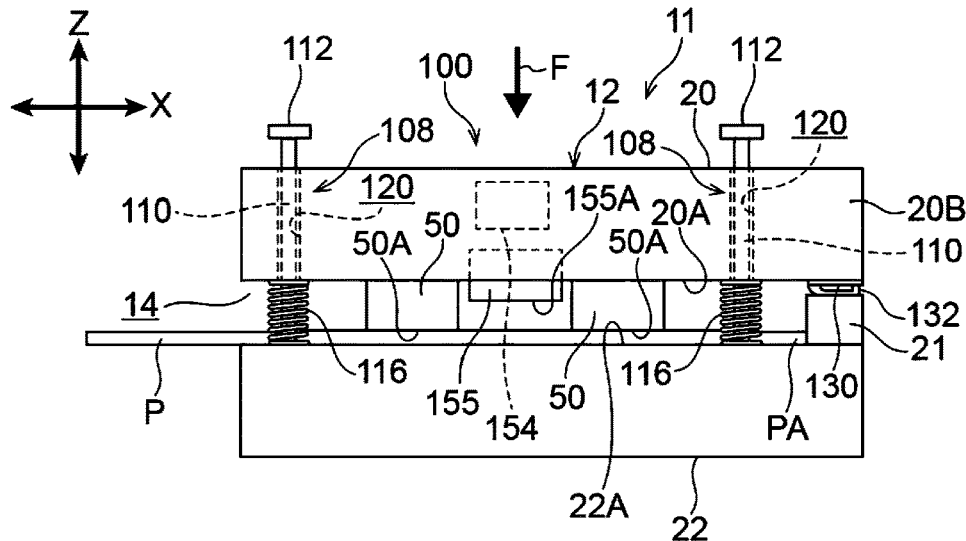

A sheet electric resistance measuring instrument 11 illustrated in FIG. 5A, FIG. 5B, and FIG. 5C is a measuring instrument that measures the electric resistance of the sheet P, which is paper or the like.

The top surface 22A of the second housing 22 serves as a placement surface onto which the sheet P is placed. The electrodes 50 are arranged on the first housing 20 so as to be spaced apart from each other in the X-axis direction and so as to project from the bottom surface 20A toward the second housing 22. A contact member 155 is disposed between the two electrodes 50. The contact member 155 is made of a conductive material, and in the second exemplary embodiment, the contact member 155 is made of a metal. Note that the contact member 155 is electrically grounded. The term "conductive" refers to the property of a material that easily conducts electricity and that has a volume resistivity of about $1 \times 10^{-3}$ Ωcm or less.

As illustrated in FIG. 5A, in the state where the first housing 20 is spaced apart from the second housing 22, a bottom surface 155A of the contact member 155 is flush with the bottom surfaces 50A of the electrodes 50.

As illustrated in FIG. 5C, an isolation mechanism 154 (see FIG. 6) enables the contact member 155 to move upward in such a manner that an upper portion of the contact member 155 is accommodated in the first housing 20. The isolation mechanism 154 may be any mechanism, and in the second exemplary embodiment, the isolation mechanism 154 is a mechanism that enables the contact member 155 to move up and down by a solenoid.

Figure 6:
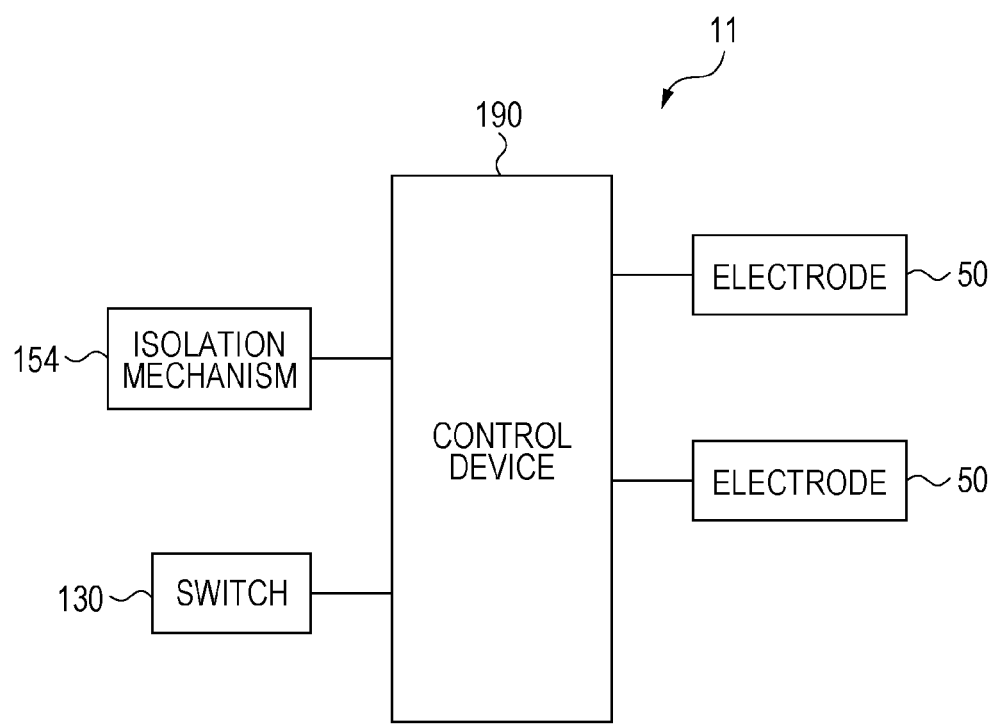
FIG. 6 is a block diagram of the sheet electric resistance measuring instrument of the second exemplary embodiment.

As illustrated in FIG. 6, the sheet electric resistance measuring instrument 11 includes the control device 190. The switch 130 (see FIG. 5A, FIG. 5B, and FIG. 5C), the electrodes 50 (see FIG. 5A, FIG. 5B, and FIG. 5C), and the isolation mechanism 154 are electrically connected to the control device 190.
[Measurement of Electric Resistance of Sheet]
Measurement of the electric resistance of the sheet P will now be described.

As illustrated in FIG. 5A, the sheet P is placed onto the top surface 22A of the second housing 22 of the sheet electric resistance measuring instrument 11. In this case, the sheet P is positioned by bringing the end portion PA of the sheet P into contact with the side surface of the projecting portion 21.

As illustrated in FIG. 5B, the measurer S (see FIG. 1) pushes the first housing 20 from above so as to bring the electrodes 50 and the contact member 155 into contact with the top surface of the sheet P. In other words, the sheet P is sandwiched between the bottom surfaces 50A of the electrodes 50 and the bottom surface 155A of the contact member 155 and the top surface 22A of the second housing 22. In addition, the switch 130 is turned on.

When a predetermined period of time has elapsed since the switch 130 has been turned on, the control device 190 (see FIG. 4) controls the isolation mechanism 154 first as illustrated in FIG. 5C so as to cause the contact member 155 to separate from the sheet P by moving upward and so as to the upper portion of the contact member 155 to be accommodated in the first housing 20.

After the contact member 155 has moved upward, the control device 190 measures the electric resistance between the two electrodes 50 that are in contact with the sheet P. Note that, in the second exemplary embodiment, the surface resistance of the sheet P between the two electrodes 50 is measured. The measured electric resistance of the sheet P is displayed on a display unit, which is not illustrated.

Note that, when the first housing 20 moves upward and the switch 130 is turned off after the measurement, the control device 190 controls the isolation mechanism 154 so as to cause the contact member 155 to return to the position illustrated in FIG. 5A.
[Effects]
Effects of the second exemplary embodiment will now be described.

In the sheet electric resistance measuring instrument 11 of the second exemplary embodiment, the electrodes 50 come into contact with the top surface of the sheet P, and the contact member 155, which is disposed between the electrodes 50, comes into contact with the sheet P.

In addition, the sheet electric resistance measuring instrument 11 of the second exemplary embodiment is placed onto, for example, a workbench (not illustrated) in such a manner that the second housing 22 faces downward, and the sheet P is placed onto the top surface 22A of the second housing 22. Then, the moving mechanism 100 enables the first housing 20 on the upper side to move from the upper side to the lower side with respect to the top surface 22A of the second housing 22 so as to bring the electrodes 50 and the contact member 155 into contact with the sheet P.

Furthermore, in the sheet electric resistance measuring instrument 11 of the second exemplary embodiment, the guiding mechanisms 108 enable the first housing 20 to move in the direction perpendicular to the top surface 22A of the second housing 22.

As described above, generation of wrinkles in the sheet P is suppressed, and thus, the likelihood that the accuracy with which the electric resistance is measured will deteriorate due to generation of wrinkles in the sheet P is reduced.

In the sheet electric resistance measuring instrument 11 of the second exemplary embodiment, the contact member 155 disposed between the two electrodes 50 is spaced apart from the sheet P while the electric resistance of the sheet P is measured between the electrodes 50.

Thus, compared with the case where the contact member 155 is in contact with the sheet P while the electric resistance of the sheet P is measured between the electrodes 50, the material of the contact member 155 may be selected from a wider range of materials. For example, the contact member 155 may be made of a metal having electrical conductivity as in the second exemplary embodiment. Note that, as a result of the contact member 155 having electrical conductivity and being electrically grounded, for example, static electricity is removed from the surface of the sheet P, and the accuracy with which the electric resistance is measured is improved.

Third Exemplary Embodiment

The sheet electric resistance measuring instrument of the third exemplary embodiment of the present disclosure will now be described. The same members as in the first and second exemplary embodiments are denoted by the same reference signs, and repeated descriptions will be omitted or simplified.

[Structure]

The structure of the sheet electric resistance measuring instrument will now be described.

Figure 7A:
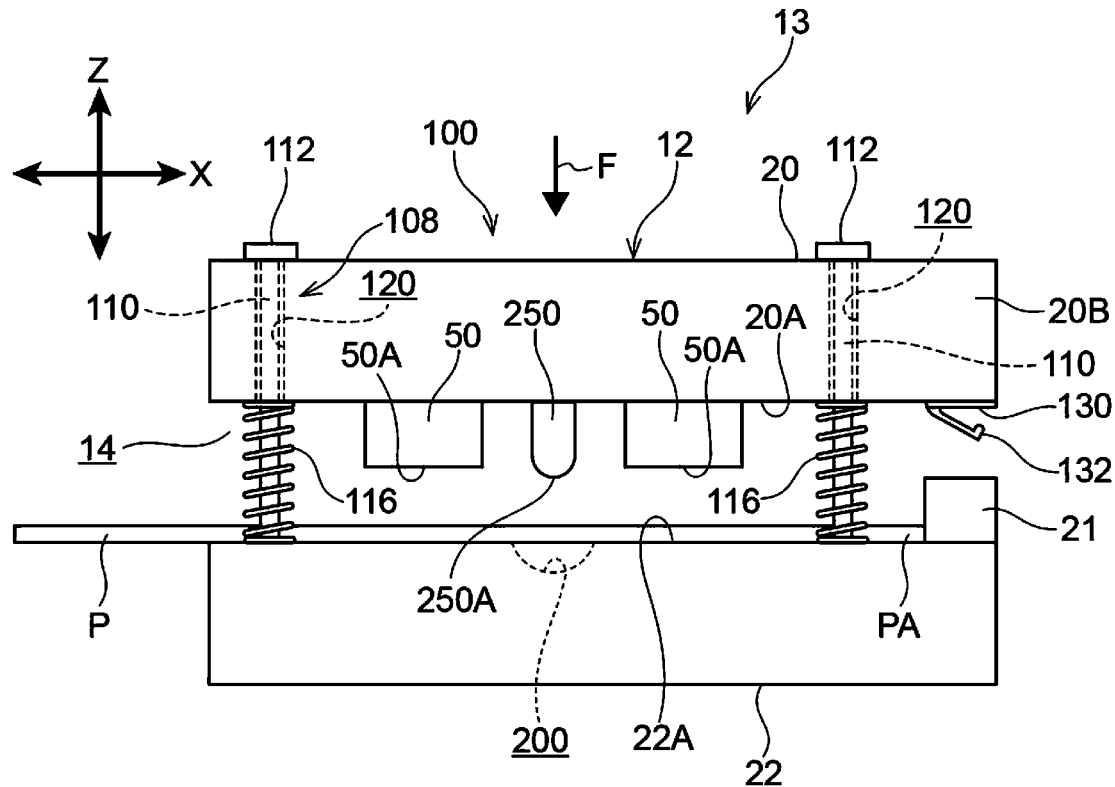
FIGS. 7A and 7B are side views of a sheet electric resistance measuring instrument of a third exemplary embodiment when viewed in the Y-axis direction, FIG. 7A being a diagram illustrating a state where a first housing has moved away from a second housing, and FIG. 7B being a diagram illustrating a state where the first housing has moved toward the second housing and where the electric resistance of the sheet is being measured.

A sheet electric resistance measuring instrument 13 illustrated in FIG. 7A and FIG. 5B is a measuring instrument that measures the electric resistance of the sheet P, which is paper or the like.

The electrodes 50 are arranged on the first housing 20 so as to be spaced apart from each other in the X-axis direction and so as to project from the bottom surface 20A toward the second housing 22. A contact member 250 is disposed between the two electrodes 50. The contact member 250 is made of an insulating material, and in the third exemplary embodiment, the contact member 250 is made of a synthetic resin.

The contact member 250 projects toward the second housing 22 further than the electrodes 50 do. In other words, a bottom surface 250A of the contact member 250 is located lower than bottom surfaces 50A of the electrodes 50.

The top surface 22A of the second housing 22 serves as a placement surface onto which the sheet P is placed. The top surface 22A of the second housing 22 has a recess 200 formed at a position that corresponds to the contact member 250.

Figure 7B:
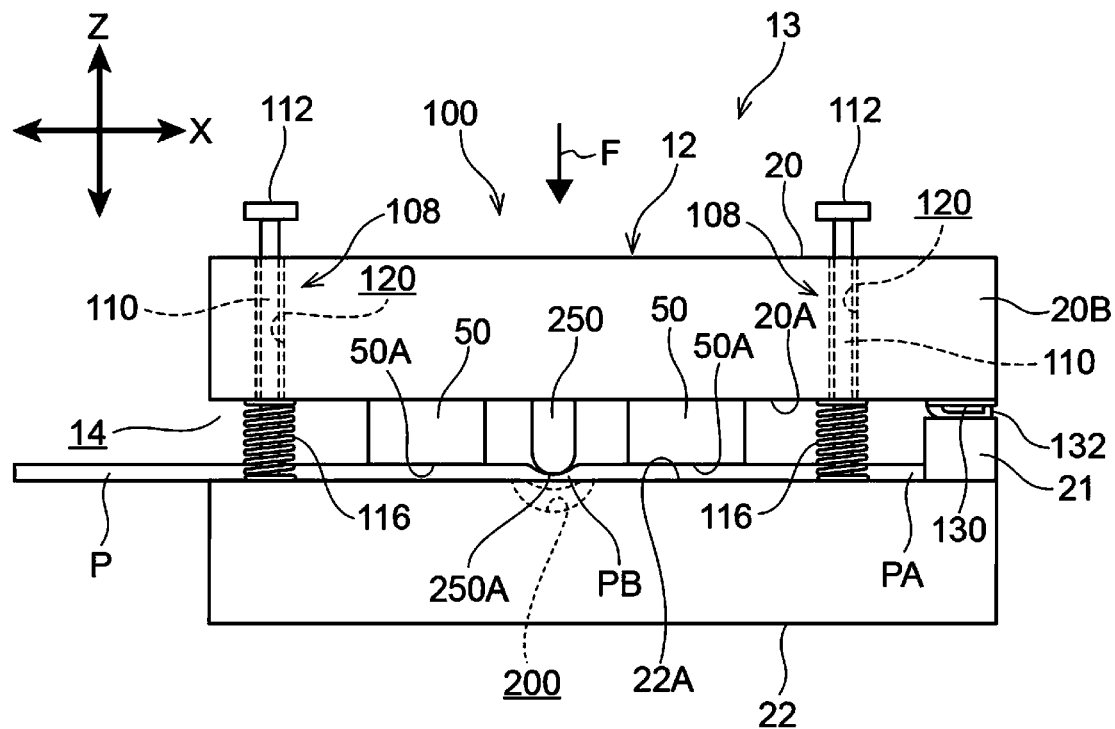
Figure 8:
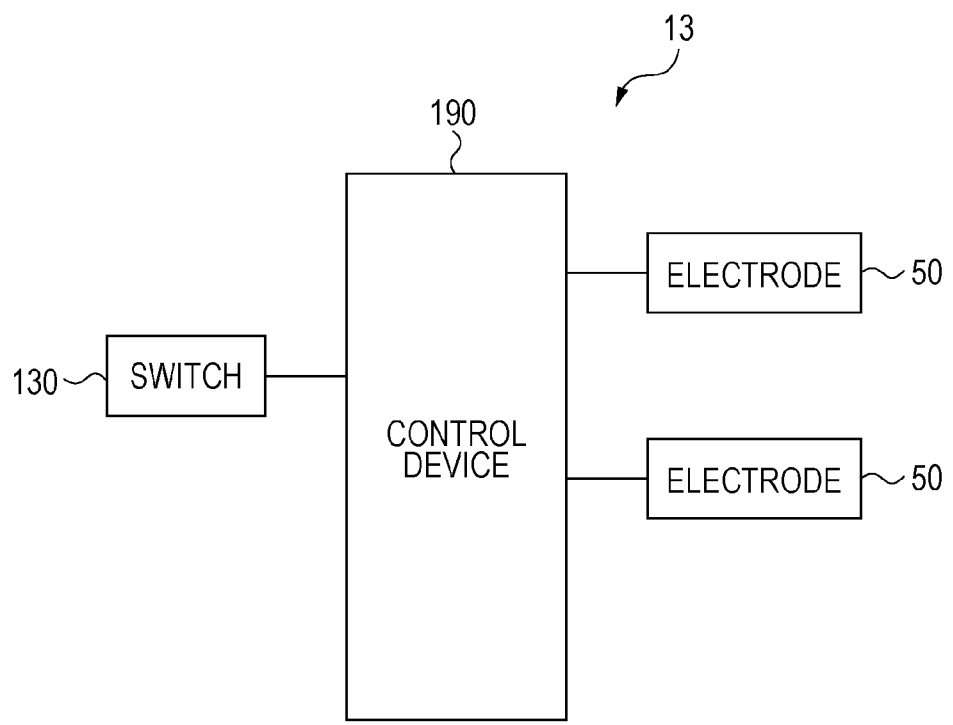
FIG. 8 is a block diagram of the sheet electric resistance measuring instrument of the third exemplary embodiment.

As illustrated in FIG. 8, the sheet electric resistance measuring instrument 13 includes the control device 190. The switch 130 (see FIG. 7A and FIG. 7B) and the electrodes 50 (see FIG. 7A and FIG. 7B) are electrically connected to the control device 190.

[Measurement of Electric Resistance of Sheet]

Measurement of the electric resistance of the sheet P will now be described.

As illustrated in FIG. 7A, the sheet P is placed onto the top surface 22A of the second housing 22 of the sheet electric resistance measuring instrument 13. In this case, the sheet P is positioned by bringing the end portion PA of the sheet P into contact with the side surface of the projecting portion 21.

As illustrated in FIG. 7B, the measurer S (see FIG. 1) pushes the first housing 20 from above so as to bring the electrodes 50 into contact with the top surface of the sheet P. In this case, the contact member 250 projecting downward further than the electrodes 50 do comes into contact with the sheet P first. The sheet P is curved by being pushed by the contact member 250, and a curved portion PB fits into the recess 200 of the top surface 22A of the second housing 22. The sheet P is sandwiched between the bottom surfaces 50A of the electrodes 50 and the bottom surface 250A of the contact member 250 and the top surface 22A of the second housing 22. In addition, the switch 130 is turned on.

When a predetermined period of time has elapsed since the switch 130 has been turned on, the control device 190 (see FIG. 8) measures the electric resistance between the two electrodes 50 that are in contact with the sheet P. Note that, in the third exemplary embodiment, the surface resistance of the sheet P between the two electrodes 50 is measured. The measured electric resistance of the sheet P is displayed on a display unit, which is not illustrated.

[Effects]

Effects of the third exemplary embodiment will now be described.

In the sheet electric resistance measuring instrument 13 of the third exemplary embodiment, before the electrodes 50 come into contact with the top surface of the sheet P, the contact member 250, which is disposed between the electrodes 50, comes into contact with the sheet P first. The sheet P is curved by being pushed by the contact member 250, and the curved portion PB fits into the recess 200 of the top surface 22A of the second housing 22.

As described above, the contact member 250 disposed between the two electrodes 50 comes into contact with the sheet P and suppresses generation of wrinkles in the sheet P.

In addition, in the sheet electric resistance measuring instrument 13 of the third exemplary embodiment, since the contact member 250 disposed between the two electrodes 50 projects downward further than the electrodes 50 do, the contact member 250 comes into contact with the sheet P first and suppresses generation of wrinkles in the sheet P, and then the electrodes 50 come into contact with the sheet P.

Here, in the third exemplary embodiment, the sheet P is curved by being pushed by the contact member 250, and the curved portion PB fits into the recess 200 of the top surface 22A of the second housing 22. As a result of the sheet P being curved by being pushed by the contact member 250 in this manner, generation of wrinkles in the sheet P is effectively suppressed.

In addition, the sheet electric resistance measuring instrument 13 of the third exemplary embodiment is placed onto, for example, a workbench (not illustrated) in such a manner that the second housing 22 faces downward, and the sheet P is placed onto the top surface 22A of the second housing 22. Then, the moving mechanism 100 enables the first housing 20 on the upper side to move from the upper side to the lower side with respect to the top surface 22A of the second housing 22 so as to bring the electrodes 50 and the contact member 250 into contact with the sheet P.

Furthermore, in the sheet electric resistance measuring instrument 13 of the third exemplary embodiment, the guiding mechanisms 108 enable the first housing 20 to move in the direction perpendicular to the top surface 22A of the second housing 22.

As described above, generation of wrinkles in the sheet P is suppressed, and thus, the likelihood that the accuracy with which the electric resistance is measured will deteriorate due to generation of wrinkles in the sheet P is reduced. Note that, in the third exemplary embodiment, the curved portion PB is formed in the sheet P. However, since the curved portion PB has a constant or substantially constant shape, formation of the curved portion PB does not affect the measurement accuracy, and the influence of formation of the curved portion PB on the measurement accuracy is negligible if at all.

Fourth Exemplary Embodiment

The sheet electric resistance measuring instrument of the fourth exemplary embodiment of the present disclosure will now be described. The same members as in the first, second, and third exemplary embodiments are denoted by the same reference signs, and repeated descriptions will be omitted or simplified.

[Structure]

The structure of the sheet electric resistance measuring instrument will now be described.

Figure 9A:
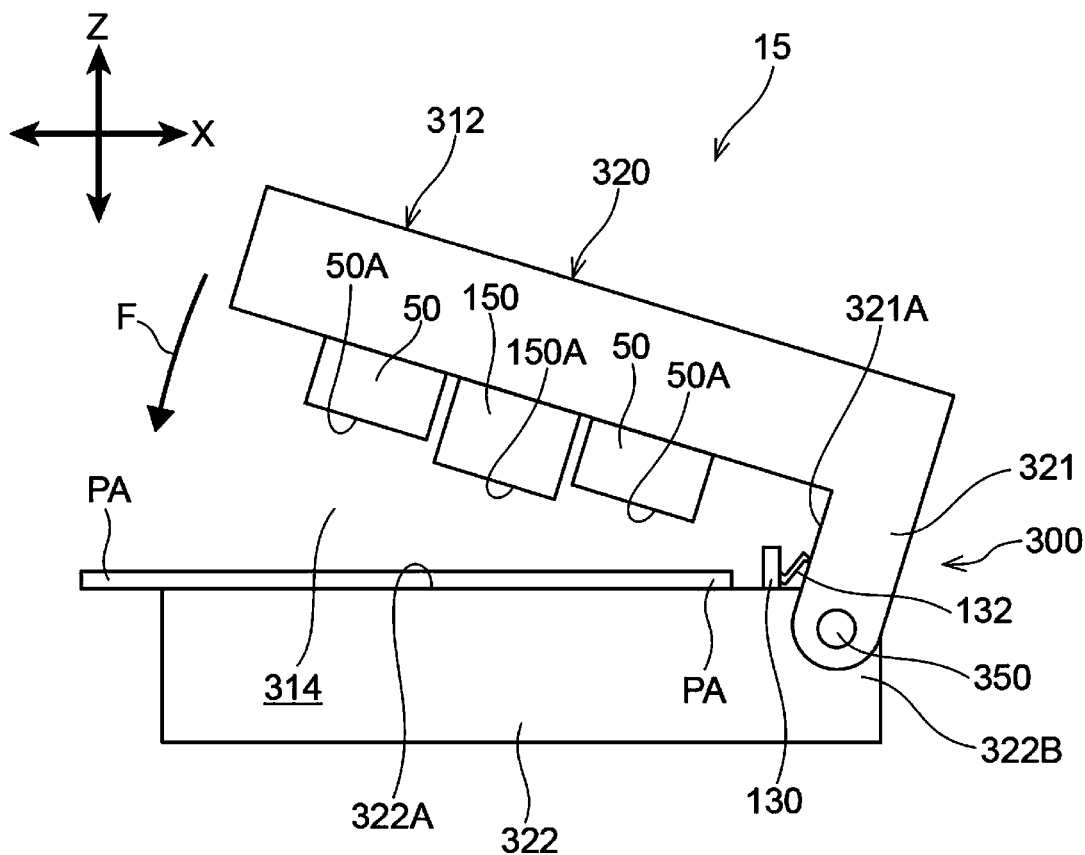
FIGS. 9A and 9B are side views of a sheet electric resistance measuring instrument of a fourth exemplary embodiment when viewed in the Y-axis direction, FIG. 9A being a diagram illustrating a state where a first housing has moved away from a second housing, and FIG. 9B being a diagram illustrating a state where the first housing has moved toward the second housing and where the electric resistance of the sheet is being measured.
Figure 9B:
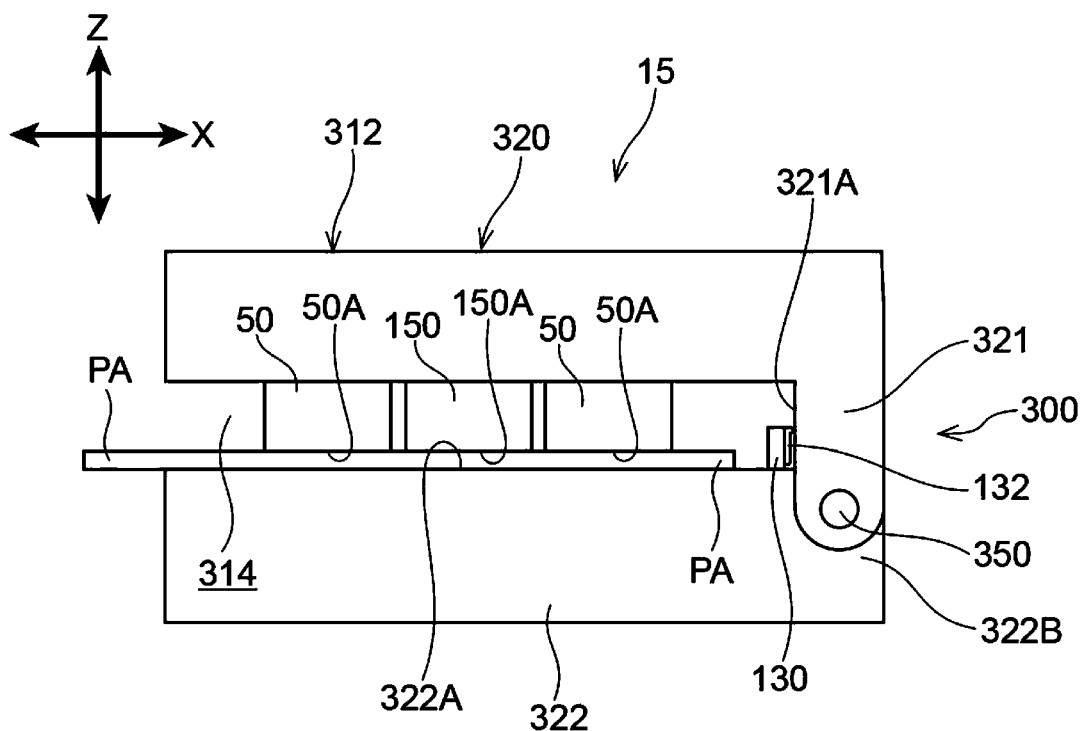

A sheet electric resistance measuring instrument 15 illustrated in FIG. 9A and FIG. 9B is a measuring instrument that measures the electric resistance of the sheet P, which is paper or the like. The sheet electric resistance measuring instrument 15 includes a housing 312 having a gap 314 formed therein, and the sheet P is to be placed in the gap 314. The housing 312 includes a first housing 320 and a second housing 322. A projecting portion 321 is formed at an end of the first housing 320 in the X-axis direction. The sheet electric resistance measuring instrument 15 of the fourth exemplary embodiment is used by being placed on, for example, a workbench, which is not illustrated, in such a manner that the second housing 322 faces downward.

The sheet electric resistance measuring instrument 15 has a pivot mechanism 300 in which the projecting portion 321 formed at the end of the first housing 320 turns on a pivot 350 with respect to an end portion 322B of the second housing 322 so as to enable the first housing 320 to perform opening and closing movements.

The switch 130 with the lever 132 is provided on the end portion 322B of the second housing 322. As illustrated in FIG. 9A, the switch 130 is off when the first housing 320 is in an open state with respect to the second housing 322.

On the other hand, as illustrated in FIG. 9B, when the measurer S (see FIG. 1) closes the first housing 320 by pushing the first housing 320 toward the second housing 322, the lever 132 of the switch 130 comes into contact with a side surface 321A of the projecting portion 321, and the switch 130 is turned on.

As illustrated in FIG. 9A and FIG. 9B, a top surface 322A of the second housing 322 serves as a placement surface onto which the sheet P is placed.

The electrodes 50 are arranged on the first housing 320 so as to be spaced apart from each other in the X-axis direction and so as to project from the bottom surface 20A toward the second housing 322. As in the first exemplary embodiment, the contact member 150 is disposed between the two electrodes 50.

Figure 10:
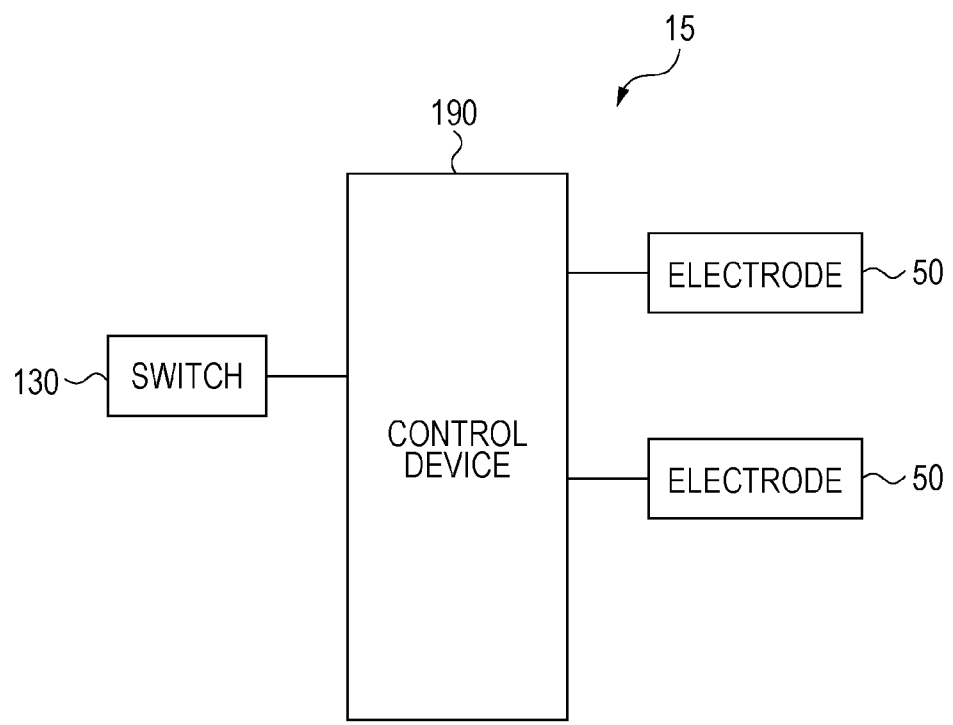
FIG. 10 is a block diagram of the sheet electric resistance measuring instrument of the fourth exemplary embodiment.

As illustrated in FIG. 10, the sheet electric resistance measuring instrument 15 includes the control device 190. The switch 130 (see FIG. 9A and FIG. 9B) and the electrodes 50 (see FIG. 9A and FIG. 9B) are electrically connected to the control device 190.

[Measurement of Electric Resistance of Sheet]

Measurement of the electric resistance of the sheet P will now be described.

As illustrated in FIG. 9A, the sheet P is placed onto the top surface 322A of the second housing 322 of the sheet electric resistance measuring instrument 15.

As illustrated in FIG. 9B, the measurer S (see FIG. 1) closes the first housing 320 so as to bring the electrodes 50 into contact with the top surface of the sheet P. In this case, the contact member 150 projecting downward further than the electrodes 50 do comes into contact with the sheet P first. Since the contact member 150 is made of rubber, the contact member 150 is elastically deformed and compressed upon the contact with the sheet P, and then the electrodes 50 come into contact with the sheet P. In other words, the sheet P is sandwiched between the bottom surfaces 50A of the electrodes 50 and the bottom surface 150A of the contact member 150 and the top surface 322A of the second housing 322. In addition, the switch 130 is turned on.

When a predetermined period of time has elapsed since the switch 130 has been turned on, the control device 190 (see FIG. 10) measures the electric resistance between the two electrodes 50 that are in contact with the sheet P. Note that, in the fourth exemplary embodiment, the surface resistance of the sheet P between the two electrodes 50 is measured. The measured electric resistance of the sheet P is displayed on a display unit, which is not illustrated.

[Effects]

Effects of the fourth exemplary embodiment will now be described.

In the sheet electric resistance measuring instrument 15 of the fourth exemplary embodiment, before the electrodes 50 come into contact with the top surface of the sheet P, the contact member 150, which is disposed between the electrodes 50, comes into contact with the sheet P first. The contact member 150 is elastically deformed and compressed upon the contact with the sheet P, so that the electrodes 50 come into contact with the sheet P. As described above, the contact member 150 disposed between the two electrodes 50 comes into contact with the sheet P, so that generation of wrinkles in the sheet P is suppressed.

In addition, in the sheet electric resistance measuring instrument 15 of the fourth exemplary embodiment, since the contact member 150 disposed between the two electrodes 50 projects downward further than the electrodes 50 do, the contact member 150 comes into contact with the sheet P first and suppresses generation of wrinkles in the sheet P, and then the electrodes 50 come into contact with the sheet P.

In addition, the sheet electric resistance measuring instrument 15 of the fourth exemplary embodiment is placed onto, for example, a workbench (not illustrated) in such a manner that the second housing 322 faces downward, and the sheet P is placed onto the top surface 322A of the second housing 322. Then, by the pivot mechanism 300 enables the first housing 320 on the upper side to move from the upper side to the lower side with respect to the top surface 322A of the second housing 322 so as to bring the electrodes 50 and the contact member 150 into contact with the sheet P.

As described above, generation of wrinkles in the sheet P is suppressed, and thus, the likelihood that the accuracy with which the electric resistance is measured will deteriorate due to generation of wrinkles in the sheet P is reduced.

In addition, in the sheet electric resistance measuring instrument 15, the projecting portion 321 formed at the end of the first housing 320 turns on the pivot 350 with respect to the end portion 322B of the second housing 322, so that the first housing 320 comes close to the top surface 322A of the second housing 322. Therefore, for example, the mechanism is simpler than that in the case where the first housing 320 moves in a direction perpendicular to the top surface 322A of the second housing 322.

<Others>

Note that the present disclosure is not limited to the above-described exemplary embodiments.

For example, in the above-described exemplary embodiments, although the two electrodes 50 are arranged so as to be spaced apart from each other in the X-axis direction, the arrangement of the electrodes 50 is not limited to this. For example, the two electrodes 50 may be arranged so as to be spaced apart from each other in the Y-axis direction.

For example, as in the first exemplary embodiment, the third exemplary embodiment, and the fourth exemplary embodiment, in the case where the contact member 150 or 250 has an insulating property, the side surface of the contact member 150 or 250 may be in contact with the side surfaces of the electrodes 50. Note that the length of the contact member in the X-axis direction, the length of the contact member in the Y-axis direction, and the shape of the contact member in plan view may be suitably set. In addition, a plurality of contact members may be arranged between the two electrodes 50.

Furthermore, for example, in the first exemplary embodiment and the fourth exemplary embodiment, although the contact member 150 is formed of an elastic body, the contact member 150 is not limited to being formed of an elastic body. A contact member that is formed of a non-elastic body may be attached to the first housing 20 or 320 with an elastic body such as a rubber member, a spring, or an air cushion body interposed between the contact member and the first housing.

The present disclosure is not limited to the configurations according to the above-described exemplary embodiments, and various configurations may be employed. In addition, the present disclosure may be implemented in various aspects within the gist of the present disclosure.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A sheet electric resistance measuring instrument comprising:
    first and second housings that are paired with each other and that sandwich a sheet from both sides of the sheet;
    a pair of electrodes that are provided on the first housing and that measure an electric resistance of the sheet sandwiched between the pair of electrodes and the second housing; and
    a contact member that is disposed between the pair of electrodes on the first housing and that is brought into contact with the sheet, wherein the contact member is made of an insulating material,
    the contact member is formed of an elastic body or is attached to the first housing with an elastic body interposed between the contact member and the first housing and projects toward the second housing further than the electrodes do before the contact member is brought into contact with the sheet.

2. The sheet electric resistance measuring instrument according to claim 1,
    wherein the contact member projects toward the second housing further than the electrodes do, and
    wherein the second housing has a recess formed at a position that corresponds to the contact member.

3. The sheet electric resistance measuring instrument according to claim 1, further comprising:
    an isolation mechanism that isolates the contact member from the sheet while an electric resistance is measured by the electrodes, wherein the isolation mechanism comprises a solenoid.

4. The sheet electric resistance measuring instrument according to claim 1, further comprising:
    a moving mechanism that enables the first housing to move from an upper side to a lower side with respect to a top surface of the second housing, wherein the moving mechanism comprises a guiding mechanisms and a coil springs, each of the guiding mechanisms includes a guide having a rod-like shape and has an insertion hole,
    wherein the sheet is placed onto the top surface of the second housing.

5. The sheet electric resistance measuring instrument according to claim 2, further comprising:
    a moving mechanism that enables the first housing to move from an upper side to a lower side with respect to a top surface of the second housing, wherein the moving mechanism comprises a guiding mechanisms and a coil springs, each of the guiding mechanisms includes a guide having a rod-like shape and has an insertion hole,
    wherein the sheet is placed onto the top surface of the second housing.

6. The sheet electric resistance measuring instrument according to claim 3, further comprising:
    a moving mechanism that enables the first housing to move from an upper side to a lower side with respect to a top surface of the second housing, wherein the moving mechanism comprises a guiding mechanisms and a coil springs, each of the guiding mechanisms includes a guide having a rod-like shape and has an insertion hole,
    wherein the sheet is placed onto the top surface of the second housing.

7. The sheet electric resistance measuring instrument according to claim 4,
    wherein the moving mechanism includes the guiding mechanism that enables the first housing to move in a direction perpendicular to the top surface of the second housing.

8. The sheet electric resistance measuring instrument according to claim 5,
    wherein the moving mechanism includes the guiding mechanism that enables the first housing to move in a direction perpendicular to the top surface of the second housing.

9. The sheet electric resistance measuring instrument according to claim 6,
- wherein the moving mechanism includes the guiding mechanism that enables the first housing to move in a direction perpendicular to the top surface of the second housing.

10. The sheet electric resistance measuring instrument according to claim 4,
- wherein the moving mechanism includes a pivot mechanism in which an end portion of the first housing turns on a pivot provided in an end portion of the second housing.

11. The sheet electric resistance measuring instrument according to claim 5,
- wherein the moving mechanism includes a pivot mechanism in which an end portion of the first housing turns on a pivot provided in an end portion of the second housing.

12. The sheet electric resistance measuring instrument according to claim 6,
- wherein the moving mechanism includes a pivot mechanism in which an end portion of the first housing turns on a pivot provided in an end portion of the second housing.

* * * * *